United States Patent [19]
Klass

[11] Patent Number: 5,933,038
[45] Date of Patent: *Aug. 3, 1999

[54] FLIP-FLOP WITH LOGIC FUNCTION INCORPORATED THEREIN WITH MINIMAL TIME PENALTY

[75] Inventor: Edgardo F. Klass, Palo Alto, Calif.

[73] Assignee: Sun Microsystems, Inc., Palo Alto, Calif.

[ * ] Notice: This patent is subject to a terminal disclaimer.

[21] Appl. No.: 08/804,907

[22] Filed: Feb. 25, 1997

[51] Int. Cl.$^6$ ........................ H03K 19/094; H03K 19/096
[52] U.S. Cl. ........................ 327/208; 327/210; 327/211; 326/98
[58] Field of Search ..................................... 327/199–203, 327/208–212, 214, 215, 218, 224, 225; 326/93, 95, 98

[56] References Cited

U.S. PATENT DOCUMENTS

| | | | |
|---|---|---|---|
| 5,208,489 | 5/1993 | Houston | 307/451 |
| 5,440,243 | 8/1995 | Lyon | 326/98 |
| 5,453,708 | 9/1995 | Gupta et al. | 326/98 |
| 5,461,331 | 10/1995 | Schorn | 326/83 |
| 5,461,649 | 10/1995 | Bailey et al. | 327/28 |
| 5,497,114 | 3/1996 | Shimozono et al. | 327/202 |
| 5,517,136 | 5/1996 | Harris et al. | 326/93 |
| 5,760,627 | 6/1998 | Gregor et al. | 327/215 |

FOREIGN PATENT DOCUMENTS

| | | | |
|---|---|---|---|
| 4-56412 | 2/1992 | Japan | 326/97 |

OTHER PUBLICATIONS

Gaddis, Neela B. et al., "A 56–Entry Instruction Reorder Buffer" *IEEE International Solid–State Circuits Conference*, 212–213 (1996).

Partovi, Ramid et al., "Flow–Through Latch and Edge–Triggered Flip–Flop Hybrid Elements", *ISSCC Slide Supplement* 104–105 (1996).

Shoji Masakazu, "CMOS Digital Circuit Technology", *Prentice Hall, NJ*, 216–217 (1988).

Yuan, Ji–Ren et al., "A True Single–Phase–Clock Dynamic CMOS Circuit Technique", *IEEE Journal of Solid–State Circuits* 22:899–900 (1987).

Yuan, Jiren and Svensson, Christer, "High Speed CMOS Circuit Technique", IEEE (1989).

Yuan, Jiren and Svensson, Christer, "New Single–Clock CMOS Latches and Flipflops with Improved Speed and Power Savings" *IEEE Journal of Solid–State Circuits* 32:62–69 (1997).

*Primary Examiner*—Tuan T. Lam
*Attorney, Agent, or Firm*—Forrest Gunnison

[57] ABSTRACT

A flip-flop circuit for use with logic gates includes a dynamic input stage and a static output stage. The flip-flop receives a single phase which defines a precharge phase and an evaluation phase. The dynamic input stage has a NMOS logic block coupled to receive one or more data signals. The dynamic input stage output signal is precharged to a logic high level during the precharge phase. During the evaluation phase, the NMOS logic block of the dynamic input stage causes the dynamic input stage to generate an output signal that either remains at a logic high level or else transitions from high-to-low by performing a logic operation of the data signals. The static output stage receives the output signal from the dynamic input stage and the clock signal. During the precharge phase, the static output stage maintains the flip-flop output signal logic at the logic level of the previous evaluation phase independently of the signal received from the dynamic input stage. During the evaluation phase, the static output stage outputs the complement of the output signal received from the dynamic input stage.

27 Claims, 3 Drawing Sheets

FLIP-FLOP WITH LOGIC FUNCTION INCORPORATED THEREIN WITH MINIMAL TIME PENALTY

FIELD OF THE INVENTION

The present invention relates to digital circuits and, more particularly, to flip-flops. Still more particularly, the present invention relates to flip-flops having logic functions.

BACKGROUND

Many high performance circuits such as, for example, microprocessors, use static flip-flops. Such a circuit typically has a large number of flip-flops with groups of logic gates connected between flip-flops, with the flip-flops operating to latch data generated by one group of logic gates for use by a next group of logic gates during the next cycle time. The circuit implemented by a group of combinational logic gates interconnected between flip-flops is commonly called a "sequential machine". These static flip-flops are commonly master-slave edge-triggered flip-flops. However, as the speeds of these high performance circuits increase, the use of conventional master-slave edge-triggered flip-flops becomes unattractive because these conventional flip-flops are relatively slow and require both the true and complement of the clock signal. Typically, these conventional static flip-flops require special clock buffers or "headers" to generate complementary clock signals.

Figure 1:
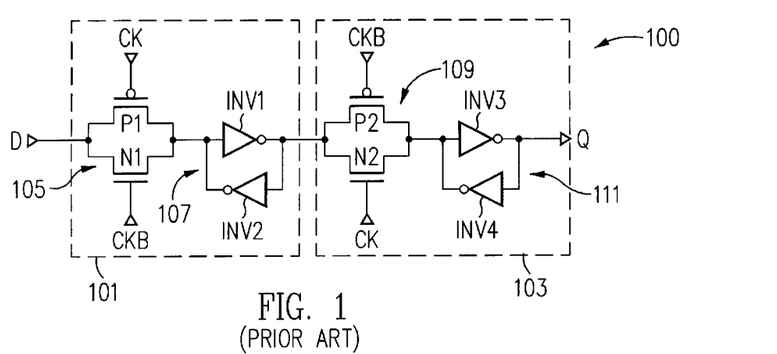
FIG. 1 is a schematic diagram of a conventional master-slave rising edge triggered static flip-flop.

FIG. 1 is a schematic diagram of a typical conventional master-slave rising edge-triggered static flip-flop 100. The flip-flop 100 includes a master stage 101 driving a slave stage 103. The master stage 101 has a conventional transmission gate 105 having an input lead coupled to receive a data signal D. As is well known, the transmission gate 105 of the master stage is controlled to transmit the received data signal D by the true and complementary clock signals CK and CKB respectively received by the p-channel and n-channel devices implementing the transmission gate 105. Thus, the master stage's transmission gate 105 is controlled to pass the data signal D prior to a rising edge (i.e., while the clock signal CK is at a logic low level).

A conventional latch 107, implemented with the inverters INV1 and INV2, has an input lead connected to output lead of the transmission gate 105. Thus, while the clock signal CK is at a logic low level, the latch 107 inverts the data signal D and latches the inverted data signal on the output lead of the master stage 101. At the rising edge of the clock signal CK, the transmission gate 105 is no longer conductive, while the latch 107 continues to output the complement of the data signal D at the time of the rising edge.

The slave stage 103 also includes a transmission gate and a latch. However, the transmission gate 109 of the slave stage 103 is configured to be conductive when the transmission gate 105 is non-conductive and vice versa. Typically, the transmission gate of the slave stage is connected to receive the clock signals CK and CKB respectively at the gates of the n-channel and p-channel devices implementing the transmission gate 109. Thus, before the rising edge of the clock signal CK, the transmission gate 109 is non-conductive. However, at the rising edge of the clock signal CK, the transmission gate 109 transmits the latched output signal of the master stage 101 (i.e., the complement of the data signal D at the time of the rising edge) to a conventional output latch, implemented with the inverters INV3 and INV4. Thus, the output latch 111 outputs a signal Q equivalent to the data signal D at the time of the rising edge for the rest of the cycle. Counting the delay of the transmission gates as ½ of a typical gate delay, the conventional flip-flop 100 has a latency of about three gate delays, measured from the set-up time of the data signal D (prior to the rising edge of the clock signal CK) to the transition of the flip-flop output signal Q after the rising edge of the clock signal CK.

This latency represents a substantial portion of the cycle time of a high-performance synchronous very large scale integration (VLSI) system. For example, in a high performance microprocessor, a latency of two to three gate delays may represent up to 20% of the cycle time. Further, because the conventional flip-flops used in these high performance synchronous systems do not perform a logic operation (i.e., the flip-flops merely latch data), the latency of the flip-flop can be considered "overhead" that reduces the performance of the system. Still further, as clock speeds increase, fewer logic gates are used between flip-flops, thereby increasing the significance of this overhead.

SUMMARY

In accordance with the present invention, a flip-flop is provided having a logic function incorporated therein. Because a flip-flop outputs a static output signal, the flip-flop is intended to be used primarily with static logic. In one embodiment, the staticized dynamic flip-flop includes a dynamic input stage and a static output stage. The dynamic input stage includes a n-channel metal-oxide-semiconductor (NMOS) logic block and is coupled to receive a single phase clock signal and one or more data signals. The dynamic input stage operates in a manner similar to a dynamic logic gate and, thus, can be described as having a precharge phase and an evaluation phase. The static output stage is coupled to receive the single phase clock signal and an internal signal X from the dynamic input stage. The static output stage generates an output signal Q as a logical function of the data signals received by the input stage.

In operation during the precharge phase, the dynamic input stage causes the internal signal X to have a predetermined logic level, independent of the logic level of the data signal D. During the precharge phase, the static output stage provides the output signal Q at the same logic level as the previous evaluation phase.

During the evaluation phase, the dynamic input stage causes the internal signal X to have a logic level as a function of the logic levels of the data signals. The static output stage then causes the output signal Q to have a logic level as a function of the logic level of the internal signal X.

Through the use of the dynamic input stage, the set-up time of the circuit is zero, thereby decreasing the latency of the flip-flop. Further, because the dynamic input stage causes the internal signal X to be initially at the predetermined logic level at the start of the evaluation phase, the dynamic input stage can be optimized to more quickly cause the logic level of the internal signal X to change in response to the data input signals. The "precharging" of the internal signal X also allows the output stage to be "skewed" to increase the speed of changing the logic level of the output signal Q caused by the internal signal X in changing from the predetermined logic level. Still further, only a single clock phase is required, unlike the two clock phases required by the aforementioned conventional flip-flops, thereby decreasing the complexity of the clock headers and decreasing the clock line loading.

By incorporating the logic function into the flip-flop, the flip-flop, in effect, operates as a logic gate with the added capability of latching data. As a result, a full gate delay can be eliminated from the critical path of a machine. Thus, in a flip-flop according to the present invention, the conventional flip-flop "overhead" is substantially eliminated, resulting in a significant increase in performance of the system.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9 is a schematic diagram of flip-flop with incorporated two-input NAND logic functionality, according to one embodiment of the present invention and.

DETAILED DESCRIPTION

Figure 2:
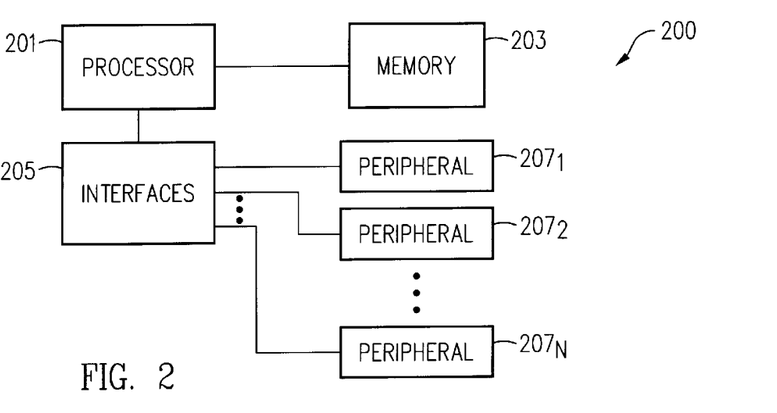
FIG. 2 is a block diagram of an electronic system that includes a flip-flop with incorporated logic functionality, according to one embodiment of the present invention.

FIG. 2 is a block diagram of an electronic system 200 according to one embodiment of the present invention. The electronic system 200 includes an integrated circuit 201 with a flip-flop with an incorporated logic function (described below in conjunction with FIGS. 3–9), a memory 203, interfaces 205 and peripherals $207_1$–$207_N$.

The electronic system 200 can be any type of electronic system. In this embodiment, the electronic system 200 is a computer system in which the integrated circuit 201 is a processor connected to the memory 203 and to interfaces 205. The processor can be any type of processor such as, for example, X86, Sparc®, Alpha®, MIPS®, HP®, and PowerPC® processors. The interfaces 205 are connected to peripherals $207_1$–$207_N$, thereby allowing the processor to interact with these peripherals. The memory 203 and the interfaces 205 can be any type of memory or interface for use in computer systems. Likewise, the peripherals can be any type of peripheral such as, for example, displays, mass storage devices, keyboards or any other type of input or input-output device. In accordance with the present invention, unlike conventional static flip-flops, the flip-flop used in the integrated circuit 201 includes a logic function incorporated therein, thereby increasing the performance of integrated circuit 201.

Figure 3:
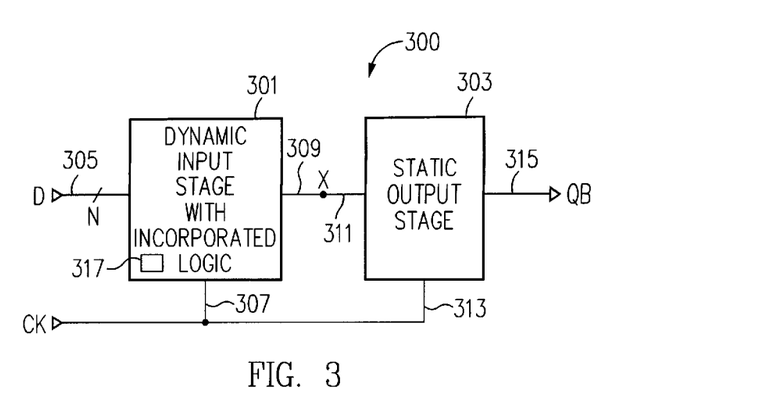
FIG. 3 is a block diagram of a flip-flip circuit with incorporated logic functionality, according to one embodiment of the present invention.

FIG. 3 is a block diagram of a flip-flop circuit 300 according to one embodiment of the present invention. In this embodiment, the flip-flop circuit 300 is a single phase (i.e., not requiring the complement of the clock signal) single rail flip-flop circuit (i.e., only outputting a single output signal). The flip-flop circuit 300 includes a dynamic input stage 301 with a NMOS logic block (not shown) and a static output stage 303. The NMOS logic block is entirely implemented using n-channel transistors. N-channel transistors generally are smaller and faster than p-channel transistors, which are required in CMOS logic gates. The size and speed advantages of n-channel transistors make practical the incorporation into the flip-flop of complex logic functions such as AND-OR and other logic functions typically avoided in CMOS logic gates (e.g., wide NOR functions, which require several stacked PMOS transistors). Except for the NMOS logic block, this embodiment is similar to the edge-triggered staticized dynamic flip-flop with conditional shut-off mechanism disclosed in commonly assigned U.S. patent application Ser. No. 08/784,282 by the present inventor, which is incorporated herein by reference in its entirety.

The dynamic input stage 301 is coupled to receive data signals D1–DN at an input port 305 and to receive a clock signal CK at an input lead 307. The NMOS logic block (not shown) of the dynamic input stage 301 outputs at an output lead 309 an internal signal X as a logic function of the logic levels of the data signals D1–DN. By incorporating this logic function into the flip-flop circuit 300, one fewer logic gate may be used in the machine. More specifically, the flip-flop circuit 300 replaces what would be the last logic gate and output flip-flop of a machine using conventional flip-flops. As a result, a full gate delay can be eliminated from the critical path of the machine. The overhead caused by a conventional flip-flop is thus substantially eliminated (i.e., a logic operation is performed instead) by the flip-flop circuit 300, resulting in a significant increase in performance of the system.

The static output stage 303 has an input lead 311 connected to the output lead 309 though which the static output stage 303 receives the internal signal X. The static output stage 303 is coupled to received the clock signal CK at an input lead 313 and outputs an output signal QB at an output lead 315. In this embodiment, the flip-flop circuit 300 enters a precharge phase when the clock signal CK transitions to the logic low level and enters an evaluation phase when the clock signal CK transitions to the logic high level.

During the precharge phase, the flip-flop circuit 300 operates as follows. The dynamic input stage 301 causes the internal signal X to be at a predetermined logic level, independent of the data input signals D1–DN. In this embodiment, the dynamic input stage 301 causes the signal X to be at a logic high level during the precharge phase for any set of logic levels of the data signals D1–DN. On the other hand, the static output stage 303 maintains the logic level of the output signal QB at the same logic level the output signal QB had during the previous evaluation phase, independent of the logic level of the received signal X.

During the evaluation phase, the flip-flop circuit 300 operates as follows. The dynamic input stage 301 outputs the internal signal X as a function of the logic levels of the data input signals D1–DN. As described above, before the start of the evaluation phase, the dynamic input stage 301 precharges the internal signal X to a logic high level. Depending on the logic levels of the data input signals D1–DN at about the start of the evaluation phase, the dynamic input stage 301 causes the internal signal X to transition to a logic low level or else remain at the logic high level.

In addition, the dynamic input stage 301 is implemented so that once the internal signal X transitions to a logic low level during the evaluation phase, the dynamic input stage 301 cannot again cause the internal signal X to have a logic high level during the same evaluation phase.

Further, a shut-off mechanism 317 in the dynamic input stage 301 maintains the logic level of the internal signal X at a logic high level, if the logic result of the function of the levels of the data signals D1–DN does not change to a logic high level within a relatively short time period (hold time) from the start of the evaluation phase (i.e., a short "window" after the rising edge of the clock signal CK). This short window helps give the flip-flop circuit 300 an edge-triggered operation. Therefore, during an evaluation phase, the dynamic input stage 301 provides an internal signal X that either remains stable at a logic high level throughout the rest of the evaluation phase, or else transitions from a logic high level to a logic low level shortly after the rising edge of the clock signal CK, remaining stable at the logic low level throughout the rest of the evaluation phase.

In addition, the transition to the evaluation phase causes the static output stage 303 to generate the output signal QB having a logic level dependent on the logic level of the internal signal X from the dynamic input stage 301. In this embodiment, the static output stage 303 provides the output signal QB having a logic level that is the equivalent to the logic level of the internal signal X. Because the logic level of the internal signal X remains stable throughout the evaluation phase shortly after the rising edge of the clock signal CK, the static output stage 303 provides the output signal QB with a static logic level throughout the rest of the evaluation phase.

Through the use of the dynamic input stage 301, the set-up time of the flip-flop circuit 300 is substantially equal to zero (i.e., the data input signals D1–DN can arrive at the flip-flop circuit 300 at about the same time as the rising edge of the clock signal CK), thereby decreasing the latency of the flip-flop circuit 300. Further, because the dynamic input stage 301 causes the internal signal X to be initially at the predetermined logic level at the start of the evaluation phase, the dynamic input stage 301 can be optimized to more quickly cause the logic level of the internal signal X to change in response to the data input signals D. This "precharging" of the internal signal X also allows the static output stage 303 to be "skewed" to increase the speed of changing the logic level of the output signal Q caused by the internal signal X in changing from the predetermined logic level. As a result, a circuit using flip-flops according to this embodiment of the present invention has a still further improvement in performance compared to conventional master-slave flip-flops.

Still further, only a single clock phase (i.e., clock signal CK) is required, unlike the two clock phases (e.g., clock signals CK and CKB) required by the aforementioned conventional flip-flop 100 (FIG. 1), thereby decreasing the complexity of the clock headers and decreasing the clock line loading. Consequently, a circuit using the flip-flop circuit 300 can use a smaller and less complex clock distribution network, which can reduce the area and power consumption of the clock distribution circuitry and interconnect compared to a circuit using conventional static flip-flops.

Figure 4:
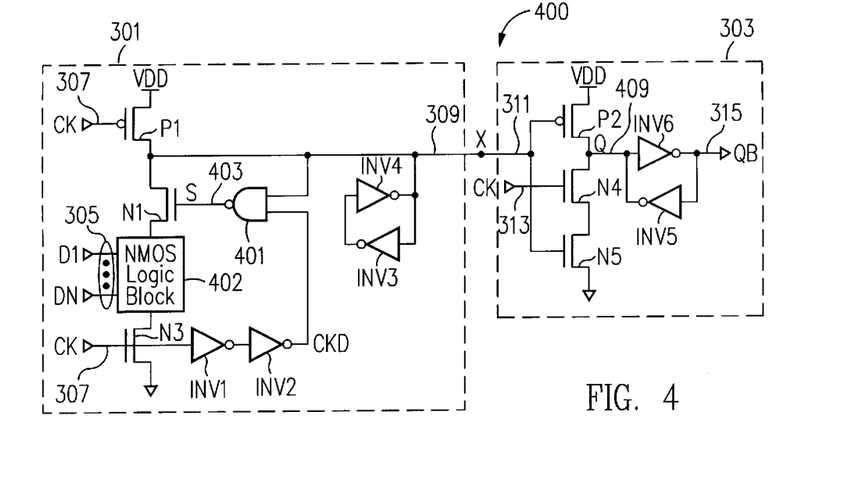
FIG. 4 is a schematic diagram of a flip-flop implementing the block diagram of FIG. 3, according to one embodiment of the present invention.

FIG. 4 is a schematic diagram of a flip-flop circuit 400 implementing the block diagram of FIG. 3, according to one embodiment of the present invention. In this embodiment, the dynamic input stage 301 includes a p-channel transistor P1, n-channel transistors N1 and N3, four inverters INV1–INV4 (the inverters INV3 and INV4 are connected "input lead-to-output lead" to form a static latch), a two-input NAND gate 401 and a NMOS logic block 402.

The elements of the dynamic input stage 301 are interconnected as follows. The p-channel transistor P1 has a source coupled to a VDD voltage source (not shown), a gate connected to the clock input lead 307, and a drain connected to the drain of the n-channel transistor N1. The drain of the n-channel transistor N1 is also connected to the output lead 309, which propagates the internal signal X. The n-channel transistor N1 has a gate connected to an output lead 403 of the NAND gate 401 and a source connected to the NMOS logic block 402. The data port 305 of the NMOS logic block 402 is connected to receive the data signals D1–DN. The NMOS logic block 402 is also connected to the drain of the n-channel transistor N3 and is configured to selectively provide a conductive path between the n-channel transistors N1 and N3 as a logical function of the logic levels of the data signals D1–DN. Examples of the NMOS logic block 402 are described below in conjunction with FIGS. 7–9. The n-channel transistor N3 has a gate connected to the clock input lead 307 and a source connected to a ground line (not shown), which provides the ground voltage (e.g., VSS). The input lead of the inverter INV1 is connected to the clock input lead 307, while the output lead of the inverter INV1 is connected to the input lead of the inverter INV2. The output lead of the inverter INV2 is connected to one input lead of the NAND gate 401. The other input lead of the NAND gate 401 is connected to the output lead 309. The inverters INV3 and INV4 are connected "input lead-to-output lead" to form a conventional static latch connected to the output lead 309.

The static output stage 303 includes a p-channel transistor P2, two n-channel transistors N4 and N5, and two inverters INV5 and INV6. The p-channel transistor P2 has a source coupled to the VDD voltage source (not shown) and a drain of the p-channel transistor P2 is connected to a line 409, which propagates an output signal Q (i.e., the complement of the output signal QB). The gate of the p-channel transistor P2 is coupled to the output lead 309 of the dynamic input stage 301 through the input lead 311 of the static output stage 303.

The n-channel transistor N5 also has a gate connected to the input lead 311. In addition, the n-channel transistor N5 has a source connected to the ground line (not shown) and a drain connected to the source of the n-channel transistor N4. The n-channel transistor N4 has a gate connected to the clock input lead 313 and a drain connected to the line 409. The line 409 is also connected to the input lead of the inverter INV6, which has its output lead connected to the output lead 315 at which the output signal QB is provided. The inverter INV5 is connected "input lead-to-output lead" with the inverter INV6, serving to latch the output signal QB.

Figure 5:
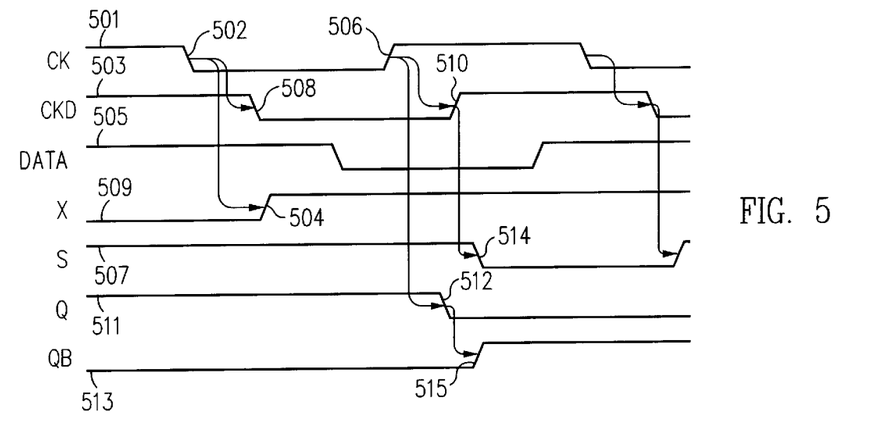
FIGS. 5 and 6 are timing diagrams illustrative of the operation of the staticized dynamic flip-flop depicted in FIG. 4.
Figure 6:
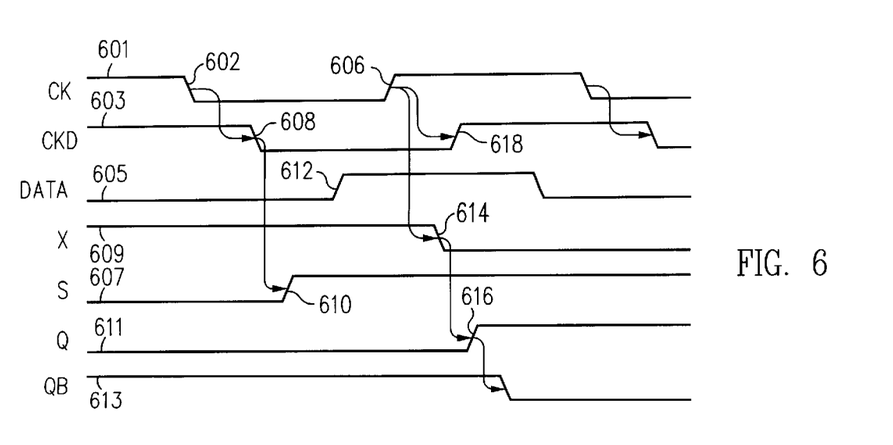

Because the input stage 301 is dynamic in nature, the flip-flop circuit 400 operates in a precharge phase and an evaluation phase. In this embodiment, the flip-flop circuit 400 is operating in the precharge phase when the clock signal CK is at a logic low level. Conversely, the flip-flop circuit 400 is operating in the evaluation phase when the clock signal CK is at a logic high level. The operation of the flip-flop circuit 400 is described below in conjunction with FIGS. 4–6. FIGS. 5 and 6 are timing diagrams illustrating the operation of the flip-flop circuit 400 for a low-to-high transition of the output signal QB and a high-to-low transition of the output signal QB, respectively.

Referring to FIGS. 4–5, the flip-flop circuit 400 performs a low-to-high transition of the output signal QB (i.e., latching a "one") as follows. In this example, the logic low level of the output signal QB before the start of the precharge phase resulted from the data signals D1–DN being at logic levels at the start of the previous evaluation phase that caused the NMOS logic block 402 to provide a conductive path between the n-channel transistors N1 and N3. The NMOS logic block is herein said to be "on" when providing the conductive path in response to the data signals D1–DN. This conductive path allowed the n-channel transistors N1 and N3 to discharge the output lead 309, which caused the internal signal X to transition from the precharge voltage to a logic low level (described below in conjunction with FIG. 6).

The flip-flop circuit 400 enters the precharge phase on the falling edge 502 of the clock signal CK, represented by the waveform 501 in FIG. 5. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off. Because the p-channel transistor P1 is on and the n-channel transistor N3 is off, the voltage of the internal signal X, represented by the waveform 509, is "pulled up" to a voltage of approximately equal to the voltage of the VDD voltage source (not shown) by the p-channel transistor P1, regardless of whether the NMOS block 402 is on or off. Thus, the internal signal X is "precharged" to about the voltage VDD independently of the logic level(s) of the data signals D1–DN (which control the NMOS logic block 402 to selectively be on or off; i.e., provide a conductive path between the n-channel transistors N1 and N3). Consequently, in this example, the internal signal X makes a low-to-high transition 504 after a relatively short delay from the falling edge 502 in turning on the p-channel transistor P1.

The now logic high level of the internal signal X then turns off the p-channel transistor P2 and turns on the n-channel transistor N5. Because the n-channel transistor N4 is off during the precharge phase, the output lead 315 is isolated from the dynamic input stage 301. Thus, the static latch formed by the inverters INV5 and INV6 causes the output signals Q and QB, respectively represented by the waveforms 511 and 513 in FIG. 5, to maintain their respective logic high and logic low levels from the previous evaluation phase.

The inverters INV1 and INV2 delay the clock signal CK to generate a delayed clock signal CKD, which is represented by the waveform 503 in FIG. 5. After this two inverter delay, the falling edge 502 of clock signal CK causes the delayed clock signal CKD to have a falling edge 508. The NAND gate 401 receives the delayed clock signal CKD at one input lead, and outputs a shut-off signal S, represented by the waveform 507 in FIG. 5, to the gate of the n-channel transistor N1. The now logic low level of the delayed clock signal CKD causes the NAND gate 401 to output the shut-off signal S with a logic high level, thereby causing the n-channel transistor N1 to be turned on.

In a situation in which the data signals D1–DN result in a high-to-low transition of the output signal Q (and thus the low-to-high transition of the output signal QB), before the end of the precharge phase, one or more of the logic levels of the data signals D1–DN change so that the NMOS logic block 402, in accordance with the NMOS logic block's logic function, electrically isolates the source of the n-channel transistor N1 from the drain of the n-channel transistor N3 (i.e., turns off the NMOS logic block 402). The waveform 505 represents the "state" of the data signals D1–DN. More specifically, when the logic levels of the data signals D1–DN cause the NMOS logic block 402 to turn on, the waveform 505 is at a logic high level. Conversely, when the data signals D1–DN cause the NMOS logic block 402 to turn off, the waveform 505 is at a logic low level. The flip-flop circuit 400 will also operate properly if the data signals D1–DN have transitions that occur about coincidentally with the end of the precharge phase (i.e., the flip-flop circuit 400 has a set-up time of about zero).

On the rising edge 506 of the clock signal CY, the flip-flop enters the evaluation phase, turning off the p-channel transistor P1 and turning on the n-channel transistors N3 and N4. However, because the data signals D1–DN caused the NMOS logic block 402 to turn off, the n-channel transistors N1 and N3 cannot discharge the output lead 309. As a result, the internal signal X remains at the logic high level of the precharge phases, due to the static latch formed by the inverters INV3 and INV4. Thus, the input stage 301 does not switch when latching a "one" and, therefore, does not add any delay during this logic operation.

Because the logic high level of the internal signal X is maintained at during this evaluation phase, the n-channel transistor N5 remains turned on and the p-channel transistor P2 remains turned off. However, the rising edge 506 of the clock signal CK (i.e., the start of the evaluation phase) turns on the n-channel transistor N4, thereby allowing the n-channel transistor N5 to discharge the line 409. Because the line 409 is discharged, the output signal Q transitions from a logic high level to a logic low level, as indicated by the falling edge 512 of the waveform 511. This high-to-low transition of the output signal Q then causes a low-to-high transition 515 of the output signal QB, via the inverter INV6. Because the n-channel transistor N5 was turned on at the start of the evaluation phase, this operation requires approximately two gate delays from the start of the evaluation phase (i.e., one gate delay for the high-to-low transition of the output signal Q and one gate delay from the inverter INV6. Of course, if the output signal QB was already at a logic high level, then the line 409 would already be discharged and, thus, the output signal QB would remain at a logic high level.

In another aspect of the invention, the rising edge 506 of the clock signal CK causes the delayed clock signal CKD to have a rising edge 510 after two short inverter delays. Because the internal signal X is already at a logic high level, the now logic high level of the delayed clock signal CKD causes the NAND gate 401 to output the shut-off signal S with a logic low level, as indicated by the falling edge 514 of the waveform 507. The new logic low level of the shut-off signal S causes the n-channel transistor N1 to turn off. This is referred to herein as the shutoff operation. The shut-off operation prevents subsequent transitions of the data signals D1–DN from turning on the NMOS logic block 402 which would result in discharging the internal signal X. Therefore, the delay of the inverters INV1 and INV2 pair plus the delay of the NAND gate 401, (referred to herein as the shut-off delay), determines the hold time of the flip-flop circuit 400 when the flip-flop circuit 400 latches a "one".

Referring to FIGS. 4 and 6, the flip-flop circuit 400 performs a high-to-low transition of the output signal QB (i.e., latching a "zero") as follows. In this example, the logic high level of the output signal QB before the start of the precharge phase was achieved as described above in conjunction with FIGS. 4 and 5, which causes the internal signal X to be at a logic high level and the shut-off signal S to be at a logic low level.

The flip-flop circuit 400 enters the precharge phase on the falling edge 602 of the clock signal CK, represented by the waveform 601 in FIG. 6. The gates of the transistors P1, N3 and N4 receive the clock signal CK and, consequently, during the precharge phase (i.e., when the clock signal CK is at a logic low level), the p-channel transistor P1 is turned on, while the n-channel transistors N3 and N4 are both turned off. Because the p-channel transistor P1 is on and the n-channel transistor N3 is off, the voltage of the internal signal X, represented by the waveform 609 in FIG. 6, is "pulled up" (or remains "pulled up" when the internal signal X is already at a logic high as in this example) to approximately the VDD voltage by the p-channel transistor P1, independently of the logic levels of the data signals D1–DN. Consequently, in this example, the internal signal X remains at a logic high level at the falling edge 602 of the clock signal CK and throughout the precharge phase.

The logic high level of the internal signal X keeps the p-channel transistor P2 turned off and the n-channel transistor N5 turned on. Because the n-channel transistor N4 is off, the output lead 315 is isolated from the dynamic input stage 301. Thus, the static latch formed by the inverters INV5 and INV6 causes the output signals Q and QB, respectively represented by the waveforms 611 and 613 in FIG. 6, to maintain during the precharge phase their respective logic low and logic high levels from the previous evaluation phase.

The inverters INV1 and INV2 delay the clock signal CK to generate the delayed clock signal CKD, which is represented by the waveform 603 in FIG. 6. The falling edge 602 of clock signal CK causes the delayed clock signal CKD to have a falling edge 608 after a relatively short two inverter delay. The NAND gate 401 receives the delayed clock signal CKD at one input lead, and outputs the shut-off signal S, represented by the waveform 607 in FIG. 6, to the gate of the n-channel transistor N1. The new logic low level of the delayed clock signal CKD causes the NAND gate 401 to output the shut-off signal S with a low-to-high transition 610, thereby causing the n-channel transistor N1 to be turned on.

In a situation in which the data signals D1–DN result in a low-to-high transition of the output signal Q (and thus the high-to-low transition of the output signal QB), one or more of the logic levels of the data signals D1–DN change so that the NMOS logic block 402 responds, in accordance with the NMOS logic block's logic function, to turn on the NMOS logic block. The waveform 605 represents the "state" of the data signals D1–DN by being at a logic high level when the data signals D1–DN turn on the NMOS logic block 402, and by being at a logic low level when turning off the NMOS logic block. The flip-flop circuit 400 will also operate properly if the data signals D1–DN have transitions that occur about coincidentally with the rising edge 606 of the clock signal CK (i.e., the flip-flop circuit 400 has a set-up time of about zero).

On the rising edge 606 of the clock signal CK, the flip-flop enters the evaluation phase, turning off the p-channel transistor P1 and turning on the n-channel transistors N3 and N4. In addition, the NMOS logic block 402 has provided a conductive path between the n-channel transistors N3 and N1. Because the n-channel transistor N1 is already turned on by the NAND gate 401, the output lead 309 of the dynamic input stage 301 is discharged through the n-channel transistors N1, N3 and the NMOS logic block 402. As a result, the internal signal X transitions to a logic low level after a relatively short gate delay, as indicated by the falling edge 614 of the waveform 609.

Because of the logic low level of the internal signal X, the n-channel transistor N5 is turned off and the p-channel transistor P2 is turned on. The turned-off n-channel transistor N5 allows the p-channel transistor P2 to pull up the voltage of the line 409, thereby causing the output signal Q to transition from a logic low level to a logic high level, as indicated by the rising edge 616 of the waveform 611. This low-to-high transition of the output signal Q occurs after approximately one gate delay from the falling edge 614 of the internal signal X. The low-to-high transition of the output signal Q then causes a high-to-low transition of the output signal QB via the inverter INV6. Thus, a high-to-low transition of the output signal QB requires about three gate delays (i.e., one gate delay to discharge the output lead 309 of the dynamic input stage 301, one gate delay to pull up the voltage of the line 409 and one gate delay from the inverter INV6). Of course, if the output signal QB was already at a logic low level during the previous evaluation phase, the output signals Q and QB would remain at logic high and logic low levels, respectively.

In another aspect of the present invention, the rising edge 606 of the clock signal CK causes the delayed clock signal CKD to have a rising edge 618 after two short inverter delays. The inverters INV1 and INV2 are sized so that the low-to-high transition of the delayed clock signal CKD occurs slightly after the high-to-low transition of the internal signal X. Because the internal signal X is already at a logic low level, the now logic high level of the delayed clock signal CKD does not cause the NAND gate 401 to change the logic level of the shut-off signal S. However, because the p-channel transistor P1 is off, once discharged, the output lead 309 (as represented by the waveform 609) cannot again be charged during this evaluation phase even if the "state" of the data signals D1–DN was to transition to a logic low level. The latch formed by the inverters INV3–INV4 prevents the voltage of the output lead 309 from floating, maintaining the internal signal X at a logic low level. This operation provides part of the edge-triggered operation of the flip-flop circuit 400.

As described above, the high-to-low transition of the internal signal X forces the shut-off signal S to remain high, thus preventing the shut-off of transistor N1. The two inverters INV1 and INV2, in effect, prevent the early shut-off of the n-channel transistor N1, since the rising edge 618 of the delayed clock signal CKD arrives slightly after the failing edge 614 of the internal signal X.

The conditional shut-off mechanism provides several advantages in the operation of the flip-flop circuit 400. As described above, the shut-off operation is conditioned to the "state" of the data signals D1–DN. Thus, when latching a one, the n-channel transistor N1 is shut-off after a short delay. Conversely, when latching a zero, the internal signal X is driven low, causing the n-channel transistor N1 to remain turned on during the rest of the clock cycle. Because the pull-down path for the dynamic input stage 301 is not cut off by the shut-off mechanism during the discharge of the output lead 309, the flip-flop circuit 400 is robust across process variations. More specifically, because the n-channel transistor N1 remains on, the shut-off mechanism causes no significant impact on the forward delay of the flip-flop when latching a zero. This feature makes possible a flip-flop design with a shorter shut-off delay, or correspondingly, a shorter hold time. If an unconditional mechanism were used, then the delay would need to be increased to ensure across process variations that the pull down path is not cut off before the output lead 309 is fully discharged. A short shut-off delay also means that the input sampling window is narrow, a feature that improves the noise immunity of the circuit. Due to the shut-off operation, input data is only sampled during the short time interval elapsed between the rising edge of the clock signal CK and the falling edge of the shut-off signal S (i.e., the shut-off delay). As is well known, shortening the sampling window improves the noise rejection threshold. Thus, this short sampling window significantly improves the input noise immunity of the flip-flop circuit 400, thereby providing a noise rejection threshold comparable to a fully static design. Note that if the power supply voltage level were increased (i.e., making input noise more severe), the inverters INV1 and INV2 would operate faster, thereby causing the sampling window to be reduced due to a shorter shut-off delay. This results in a noise rejection threshold that virtually tracks the power supply voltage level and, also, process and temperature changes, thereby adding robustness and process independence to the design.

Figure 7:
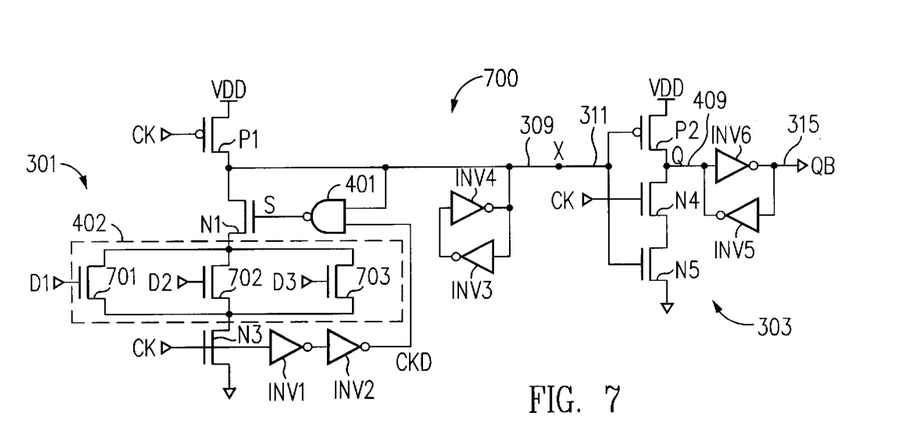
FIG. 7 is a schematic diagram of a flip-flop with incorporated three-input NOR functionality, according to one embodiment of the present invention.

FIG. 7 schematically illustrates a flip-flop circuit 700 having an incorporated three-input NOR functionality, according to one embodiment of the present invention. Thus, the dynamic input stage 301 in this embodiment receives three data signals D1–D3. The flip-flop circuit 700 is substantially similar to the flip-flop circuit 400 (FIG. 4) except that the NMOS logic block 402 (FIG. 4) is shown implemented in FIG. 7 with three n-channel transistors 701–703. In this embodiment, the n-channel transistors 701–703 are NMOS transistors having their sources connected to the drain of the n-channel transistor N3 and their drains connected to the source of the n-channel transistor N1. The gates of the n-channel transistors 701–703 are respectively connected to receive the data signals D1–D3.

The flip-flop circuit 700 operates as described above in conjunction with FIGS. 4–6, with the logic function being the logical NOR of the three data signals D1–D3. When any one or more of the data signals D1–D3 is at a logic high level when the evaluation phase begins, one or more of the n-channel transistors will be turned on, thereby providing a conductive path between the source of the n-channel transistor N1 and the drain of the n-channel transistor N3. As described above in conjunction with FIGS. 4 and 6, when the NMOS logic block 402 provides such a conductive path, the flip-flop circuit latches a "zero".

Conversely, if all of the data signals D1–DN are at a logic low level at the start of an evaluation phase, then all of the n-channel transistors 701–703 are turned off, thereby electrically isolating the drain of the n-channel transistor N3 from the source of the n-channel transistor N1. As described above in conjunction with FIGS. 4 and 5, when the NMOS logic block 402 provides such electrically isolation, the flip-flop circuit latches a "one". Accordingly, the flip-flop circuit 700 incorporates a three-input NOR logic function because the flip-flop circuit 700 latches a "zero" when any of the data signals D1–D3 are at a logic high level at the start of the evaluation phase and latches a "one" only when all of the data signals D1–D3 are at logic low levels.

Figure 8:
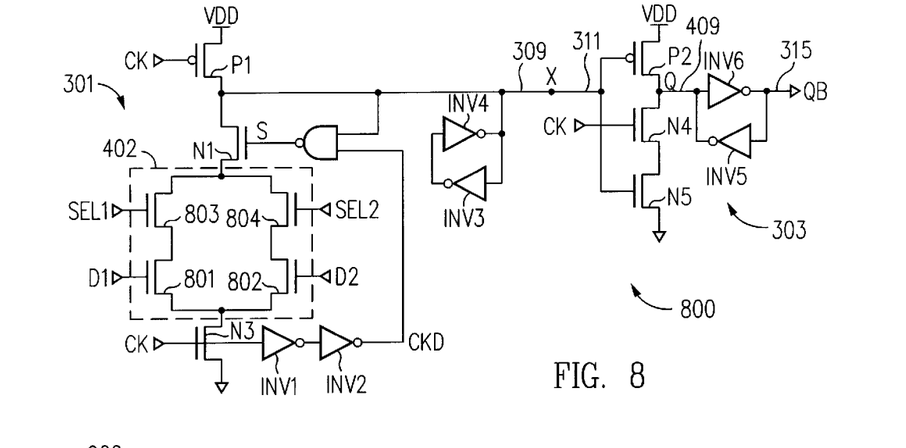
FIG. 8 is a schematic diagram of a flip-flop with incorporated inverting two-input multiplexer functionality, according to one embodiment of the present invention.

FIG. 8 schematically shows a flip-flop circuit 800 having an incorporated inverting two-input multiplexer functionality, according to one embodiment of the present invention. Thus, the dynamic input stage 301 in this embodiment receives two data signals D1 and D2. The flip-flop circuit 800 is substantially similar to the flip-flop circuit 400 (FIG. 4) except that the NMOS logic block 402 (FIG. 4) is shown implemented in FIG. 8 with four n-channel transistors 801–804. The n-channel transistors 801 and 802 have their sources connected to the drain of the n-channel transistor N3 and their gates respectively connected to receive the data signals D1 and D2. The n-channel transistors 803 and 804 have their sources respectively connected to the drains of the n-channel transistors 801 and 802, and have their drains connected to the source of the n-channel transistor N1. The gates of the n-channel transistors 803 and 804 are respectively connected to receive select signals SEL1 and SEL2. The use of the NMOS logic block avoids the need for pull-up transistors in the multiplexing operation. Thus, there is no contention problem if the select signals cause more than one data signal to be selected. Stated another way, the select signals need not be mutually exclusive. This feature can be advantageously used in logic circuits with scan design testing circuitry, which may generate non-mutually exclusive select signals. Thus, in conventional multiplexers, the testing scheme must be constrained to generate only mutually exclusive select signals to avoid contention problems. Thus, this feature can significantly reduces the complexity of scan design testing schemes.

The flip-flop circuit 800 operates as described above in conjunction with FIGS. 4–6, with the logic function being the two-input inverting multiplexer function for selecting between the two data signals D1 and D2 in response to the select signals SEL1 and SEL2. The select signals SEL1 and SEL2 are constrained to have complementary logic values. Thus, when the select signals SEL1 and SEL2 are respectively at logic high and logic low levels when the evaluation phase begins, the n-channel transistors 803 and 804 are respectively turned on and off, thereby "selecting" the data signal D1. Conversely, when the select signals SEL1 and SEL2 are respectively at logic low and logic high levels when the evaluation phase begins, the n-channel transistors 803 and 804 are respectively turned off and on, allowing the data signal D2 to be selected. Accordingly, if the selected data signal is at a logic high level (i.e., a "one") when the evaluation phase begins, the n-channel transistor receiving the selected data signal will be turned on, thereby providing a conductive path between the source of the n-channel transistor N1 and the drain of the n-channel transistor N3. As described above in conjunction with FIGS. 4 and 6, when the NMOS logic block 402 provides such a conductive path, the flip-flop circuit latches a "zero", thereby outputting a signal equivalent to the complement of the selected data signal.

Conversely, if the selected data signal is at a logic low level (i.e., a "zero") at the start of an evaluation phase, then the n-channel transistor receiving the selected data signal is turned off, thereby turning off the NMOS logic block 402. As described above in conjunction with FIGS. 4 and 5, when the NMOS logic block 402 is off, the flip-flop circuit latches a "one", thereby outputting a signal equivalent to the complement of the selected data signal.

Figure 9:
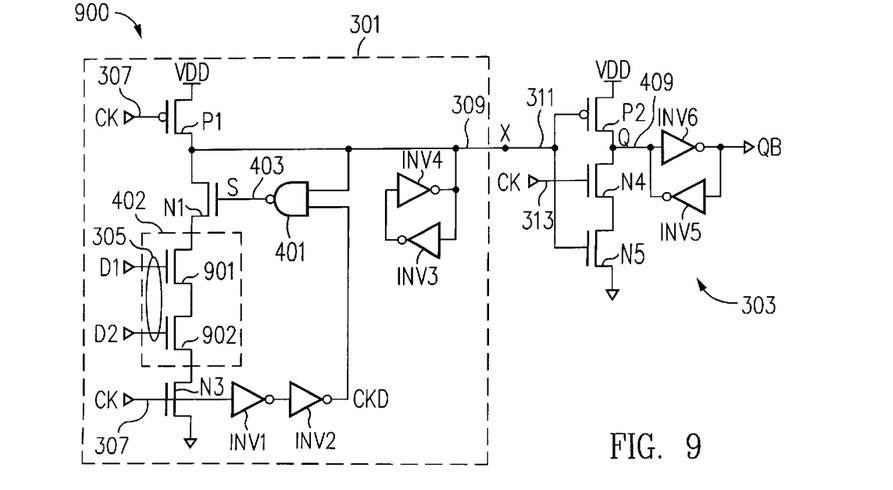

FIG. 9 schematically illustrates a flip-flop circuit 900 having an incorporated two-input NAND functionality, according to one embodiment of the present invention. Thus, the dynamic input stage 301 in this embodiment receives two data signals D1 and D2. The flip-flop circuit 900 is substantially similar to the flip-flop circuit 400 (FIG. 4) except that the NMOS logic block 402 (FIG. 4) is shown implemented in FIG. 7 with two n-channel transistors 901 and 902. In this embodiment, the n-channel transistors 901 and 902 are NMOS transistors having their channel regions connected in series between the drain of the n-channel transistor N3 and their drains connected to the source of the n-channel transistor N1. More specifically, the n-channel transistor 901 has a drain connected to the source of the n-channel transistor N1 and has a source connected to the drain of the n-channel transistor 902. The source of the n-channel transistor 902 is connected to the drain of the n-channel transistor N3. The gates of the n-channel transistors 901 and 902 are respectively connected to receive the data signals D1 and D2.

The flip-flop circuit 900 operates as described above in conjunction with FIGS. 4–6, with the logic function being the logical NAND of the two data signals D1 and D2. When both of the data signals D1 and D2 are at logic high levels when the evaluation phase begins, the n-channel transistors 901 and 902 will be turned on, thereby turning on the NMOS logic block 402. As described above in conjunction with FIGS. 4 and 6, when the NMOS logic block 402 is turned on, the flip-flop circuit latches a "zero".

Conversely, if one or both of the data signals are at a logic low level at the start of an evaluation phase, then n-channel transistor 901 and/or 902 will be turned off, thereby turning off the NMOS logic block 402. As described above in conjunction with FIGS. 4 and 5, when the NMOS logic block 402 is turned off, the flip-flop circuit latches a "one". Accordingly, the flip-flop circuit 900 incorporates a two-input NAND logic function because the flip-flop circuit 900 latches a "one" when the data signals D1 and/or D2 are at a logic low level at the start of the evaluation phase and latches a "zero" only when both of the data signals D1 and D2 are at logic high levels.

PERFORMANCE

The embodiments described above are fast for several reasons. First, the set-up time is zero because the data signals D1–DN can arrive simultaneously with the rising edge of the clock signal CK. Second, because the input stage 301 is dynamic (i.e., there is no complementary PMOS device turned on during the evaluation phase), there is less parasitic capacitance at the lead 309 and no "fight" between complementary devices during evaluation. Both of these factors contribute to increase the speed of the circuit when latching a logic "zero". Further, because latching a "one" takes two gate delays while latching a "zero" takes three gate delays, the output stage 303 can be "skewed" to further speed up the delay of the circuit when latching a logic "zero". For example, the output stage 303 can use a relatively large p-channel transistor P2 and relatively small n-channel transistors N4 and N5. As a result, the latency of the flip-flop circuits are about two-thirds that of a conventional master-slave static flip-flop using transfer gates. Although the incorporation of the logic function results in a latency increase, this time penalty is minimal and, in some cases, is nearly zero. Neglecting parasitic capacitances, the time penalty of incorporating logic into the flip-flop can be measured as the number of added series transistors in the input-to-output path of the flip-flop. Thus, for the flip-flop circuit 700 (with three-input NOR function) of FIG. 7, the time penalty is zero because the number of input-to-output series transistors remains unchanged relative to a similar flip-flop without the incorporated logic function (see the aforementioned patent application Ser. No. 08/784,282). Thus, the incorporation of the NOR function adds virtually no time penalty. For a flip-flop circuit incorporating a N-input NAND function, N-1 series n-channel transistors are added in the input-to-output path of the flip-flop. The N-1 series n-channel transistors are the minimum number of series transistors that can achieve the NAND function. Thus, for example, the flip-flop circuit 900 (with the two-input NAND function) of FIG. 9 has only one added series n-channel transistor. In addition to the elimination of a[]gate delay due to incorporating the logic function, circuit simulations show that the flip-flop circuit 900 is about 25% faster than a conventional static master-slave flip-flop with no incorporated logic. The flip-flop circuit 800 (with the two-input multiplexer function) also adds only one n-channel series transistor and, thus, would have a comparable speed advantage over the conventional static master-slave flip-flop.

The hold time of the flip-flop circuit 400 when latching a logic "one" is limited to three gate delays (i.e., two inverters plus a NAND gate). Because of the conditional shut-off mechanism, these gates can be highly skewed, resulting in a shorter hold time approximately equal to one unskewed gate delay. On the other hand, the hold time when latching a logic "zero" is established by delay of the input stage 301 (including the NMOS logic block) in discharging the output lead 309, since the data signals D1–DN must be stable until the internal signal X is fully evaluated.

Although requiring more devices, the flip-flop circuit 400 is smaller than the conventional static flip-flop 100 (FIG. 1). This smaller size is achieved because many of the devices needed in the flip-flop circuit 400 are minimum sized devices, whereas relatively large transmission gates are required in the conventional flip-flop 100. In addition, the flip-flop circuit 400 presents approximately half the clock load of the conventional static flip-flop because no complementary devices are used to receive the clock signal. This factor significantly reduces clock power, simplifies the clock header (because only one clock phase is needed), and can help simplify the clock distribution network. The circuit also reduces the data-dependent gate capacitance variations seen by the clock header, which helps to minimize the clock skew. Further, the flip-flop circuit 400 dissipates about the same amount of power as the conventional static flip-flop 100, taking into consideration the power dissipation of clock signal and data signal drivers.

The embodiments of the staticized dynamic flip-flop described above are illustrative of the principles of this invention and are not intended to limit the invention to the particular embodiments described. For example, those skilled in the art of flip-flops can implement an JFET (or other transistor technology) embodiment in view of this disclosure without undue experimentation. Those skilled in the art of flip-flops can also implement a "complementary" embodiment, in which the flip-flop circuit has "series" p-channel devices and n-channel "hold" devices. Accordingly, while the preferred embodiment of the invention has been illustrated and described, it will be appreciated that in view of the present disclosure, various changes can be made therein without departing from the spirit and scope of the invention.

The embodiments of the invention in which an exclusive property or privilege is claimed are defined as follows:

1. A circuit configured to operate in a first phase and a second phase, said circuit comprising:
  a first stage having:
    a data port wherein said data port is coupled to receive a plurality of data signals;
    a clock input lead wherein said clock input lead is coupled to receive a clock signal, said first phase occurring when said clock signal has a first logic level and said second phase occurring when said clock signal is has a second logic level;
  an output lead;
  a logic block having a second lead coupled to said output lead of said first stage, a plurality of leads coupled to said data port, and a first lead, wherein said logic block is configured to provide a conductive path between said first and second leads of said logic block as a function of a logic state of said plurality of data signals;
  a shut-off mechanism coupling said output lead of said first stage to said second lead of said logic block, wherein:
    during said first phase, said first stage is operative to provide at said output lead of said first stage a first phase output signal having a predetermined logic level, and during said second phase, said first stage is operative to provide at said output lead of said first stage a second phase output signal as a function of a logic state of said plurality of data signals received at said data port of said first stage; and a second stage having a first input lead coupled to said output lead of said first stage, a second input lead coupled to said clock input lead of said first stage, and an output lead, wherein:

during said first phase, said second stage is operative to maintain at said output lead of said second stage an output signal generated by said second stage prior to said first phase, said second stage maintaining said output signal of said second stage independently of said first phase output signal provided by said first stage during said first phase, and during said second phase, said second stage is operative to provide at said output lead of said second stage an output signal as a function of a logic level of said second phase output signal of said first stage and further wherein said shut-off mechanism maintains said predetermined logic level at said output lead of said first stage throughout said second phase in response to said second phase output signal of said first stage having a logic level equivalent to said predetermined logic level throughout a shut-off delay, said shut-off delay having a predetermined time period starting when said second phase starts.

2. The circuit of claim 1 wherein said first stage further comprises:

a switch having a first terminal coupled to a first voltage source, a second terminal coupled to said clock input lead of said first stage, and a third terminal coupled to said first lead of said logic block, wherein said switch is configured to provide a conductive path between said first terminal and said third terminal during said second phase.

3. The circuit of claim 1, wherein, during said second phase, said shut-off mechanism is configured to provide a conductive path between said output lead of said first stage and second lead of said logic block when said second phase output signal of said first stage has a logic level different from said predetermined logic level and to open-circuit said conductive path when said second phase output signal of said first stage has a logic level equivalent to said predetermined logic level.

4. The circuit of claim 2, wherein said shut-off mechanism comprises:

a first transistor having a first lead coupled to said output lead of said first stage, a second lead coupled to said second lead of said logic block, and a third lead;

a first inverter having an input lead coupled to said clock input lead of said first stage;

a second inverter having an input lead coupled to an output lead of said first inverter; and a logic gate having a first input lead coupled to said output lead of said first stage, a second input lead coupled to an output lead of said second inverter, and an output lead coupled to said third lead of said first transistor.

5. The circuit of claim 4, wherein said switch comprises a second transistor.

6. The circuit of claim 1, wherein said first stage further comprises a latch circuit coupled to said output lead of said first stage.

7. The circuit of claim 1, wherein, during said second phase, when said first stage provides said second phase output signal of said first stage having a logic level different from said predetermined logic level, said first stage is configured to maintain said logic level of said second phase output signal throughout said second phase.

8. The circuit of claim 1, wherein said first stage further comprises a third transistor having a first lead coupled to a second voltage source, a second lead coupled to said clock input lead of said first stage, and a third lead coupled to said output lead of said first stage.

9. The circuit of claim 1, wherein said second stage comprises:

a fourth transistor having a first lead coupled to said output lead of said first stage and having a second lead coupled to said output lead of said second stage;

a fifth transistor having a first lead coupled to said second input lead of said second stage, and having a second lead coupled to said output lead of said second stage; and a sixth transistor having a first lead coupled to said output lead of said first stage and having a second lead coupled to a third lead of said fifth transistor.

10. The circuit of claim 9, wherein during said second phase:

said fifth transistor is configured to be conductive, and said fourth and sixth transistors are configured so that said fourth transistor is conductive when said sixth transistor is non-conductive and said fourth transistor is non-conductive when said sixth transistor is conductive, said sixth transistor being conductive when said output signal from said first stage is at said predetermined logic level.

11. The circuit of claim 10, further comprising a second latch circuit coupling said second lead of said fourth transistor and said second lead of said fifth transistor to said output lead of said second stage.

12. The circuit of claim 1, wherein said clock signal is an only clock signal coupled to said circuit.

13. The circuit of claim 1, wherein said circuit is configured to provide said output signal of said second stage with a logic low level with a maximum delay, measured from a starting edge of said clock signal, equivalent to a sum of three gate delays.

14. The circuit of claim 1, wherein said circuit is configured to provide said output signal of said second stage with a logic high level with a maximum delay, measured from a starting edge of said clock signal, equivalent to a sum of two gate delays.

15. The circuit of claim 2 wherein said logic block comprises a plurality of n-channel transistors, wherein each transistor of said plurality of n-channel transistors has a gate coupled to a corresponding lead of said plurality of leads of said logic block.

16. A method of implementing a flip-flop, said flip-flop receiving a clock signal having a first clock period followed by a second clock period, said method comprising:

during a second phase of said first clock period, providing an output signal having a constant logic level;

during a first phase of said second clock period:
precharging a voltage of an internal node of said flip-flop to a predetermined logic level, and
providing said output signal with said constant logic level equivalent to said constant logic level of said output signal during said second phase of said first clock period; and during a second phase of said second clock period:
receiving a plurality of data signals each having a logic level, said plurality of data signals having a logic state depending on said logic levels of said plurality of data signals, causing said voltage of said internal node to be at a logic level as a function of said logic state of said plurality of data signals received during said second phase of said second clock period, providing said output signal with a logic level as a function of said logic state of said plurality of data signals received during said second phase of said second clock period, and maintaining said predetermined logic level of said voltage of said internal node throughout said second phase in response to said voltage of said internal node having a logic level equivalent to said predetermined logic level throughout a predetermined time period beginning when said second phase of said second clock period begins irrespective of a change in said logic state of said plurality of data signals after said predetermined time period and during said second phase of said second clock period.

17. The method of claim 16 wherein said function comprises a logical NAND of said plurality of data signals.

18. The method of claim 16 wherein said function comprises a logical NOR of said plurality of data signals.

19. The method of claim 16 wherein said function comprises a multiplexing operation of said plurality of data signals.

20. A flip-flop configured to operate in a first phase and a second phase, said flip-flop comprising:

an input stage having:
　a data port wherein said data port is coupled to receive a plurality of data signals;
　a clock input lead wherein said clock input lead is coupled to receive a clock signal, said first phase occurring when said clock signal has a first logic level and said second phase occurring when said clock signal has a second logic level;
　an output lead;
　a logic block having a second lead coupled to said output lead of said first stage, a plurality of leads coupled to said data port, and a first lead, wherein said logic block provides a conductive path between said first and second leads of said logic block as a function of a logic state of said plurality of data signals; and
a shut-off logic circuit coupling said output lead of said first stage to said second lead of said logic block, wherein:
　during said first phase, said input stage is operative to provide at said output lead of said input stage a first phase output signal having a predetermined logic level, and
　during said second phase, said input stage is operative to provide at said output lead of said input stage a second phase output signal as a function of a logic state of said plurality of data signals received at said data port of said input stage; and an output stage having a first input lead coupled to said output lead of said input stage, a second input lead coupled to said clock input lead of said input stage, and an output lead, wherein:
　during said first phase, said output stage is operative to maintain at said output lead of said output stage an output signal generated by said output stage prior to said first phase, said output stage maintaining said output signal of said output stage independently of said first phase output signal provided by said input stage during said first phase, and
　during said second phase, said output stage is operative to provide at said output lead of said output stage an output signal as a function of a logic level of said second phase output signal of said input stage and further wherein said shut-off logic circuit maintains said predetermined logic level at said output lead of said input stage throughout said second phase in response to said second phase output signal of said input stage having a logic level equivalent to said predetermined logic level throughout a shut-off delay, said shut-off delay having a predetermined time period starting when said second phase starts.

21. The flip-flop of claim 20 wherein said input stage further comprises:
　a switch having a first terminal coupled to a first voltage source, a second terminal coupled to said clock input lead of said first stage, and a third terminal coupled to said first lead of said login bloc, wherein said switch is configured to provide a conductive path between said first terminal and said third terminal during said second phase.

22. The flip-flop of claim 20, wherein, during said second phase, said shut-off logic circuit provides a conductive path between said output lead of said input stage and second lead of said logic block when said second phase output signal of said input stage has a logic level different from said predetermined logic level and to open-circuit said conductive path when said second phase output signal of said input stage has a logic level equivalent to said predetermined logic level for said predetermined time period.

23. The flip-flop of claim 20, wherein said clock signal is an only clock signal coupled to said flip-flop.

24. The flip-flop of claim 20, wherein said flip-flop is configured to provide said output signal of said output stage with a logic high level with a maximum delay, measured from a starting edge of said clock signal, equivalent to a sum of two gate delays.

25. The flip-flop of claim 20, wherein said flip-flop is configured to provide said output signal of said output stage with a logic low level with a maximum delay, measured from a starting edge of said clock signal, equivalent to a sum of three gate delays.

26. A computer system comprising:

a memory;

an interface;

a peripheral coupled to said interface; and a processor coupled to said memory and said interface, said processor configured to access said memory and said interface, said processor configured to access said memory and to interact with said peripheral through said interface, said processor including a flip-flop comprising:

an input stage having:
　a data port wherein said data port is coupled to receive a plurality of data signals;
　a clock input lead wherein said clock input lead is coupled to receive a clock signal; said flip-flop operates in a first phase when said clock signal has a first logic level and in a second phase when said clock signal has a second logic level;
　an output lead;
　a logic block having a second lead coupled to said output lead of said first stage, a plurality of leads coupled to said data port, and a first lead, wherein said logic block provides a conductive path between said first and second leads of said logic block as a function of a logic state of said plurality of data signals; and a shut-off logic circuit coupling said output lead of said first stage to said second lead of said logic block, wherein:

during said first phase, said input stage is operative to provide at said output lead of said input stage a first phase output signal having a predetermined logic level, and during said second phase, said input stage is operative to provide at said output lead of said input stage a second phase output signal as a function of a logic state of said plurality of data signals received at said data port of said input stage; and an output stage having a first input lead coupled to said output lead of said input stage, a second input lead coupled to said clock input lead of said input stage, and an output lead, wherein:

during said first phase, said output stage is operative to maintain at said output lead of said output stage an output signal generated by said output stage prior to said first phase, said output stage maintaining said output signal of said output stage independently of said first phase output signal provided by said input stage during said first phase, and during said second phase, said output stage is operative to provide at said output lead of said output stage an output signal as a function of a logic level of said second phase output signal of said input stage and further wherein said shut-off logic circuit maintains said predetermined logic level at said output lead of said input stage throughout said second phase in response to said second phase output signal of said input stage having a logic level equivalent to said predetermined logic level throughout a shut-off delay, said shut-off delay having a predetermined time period starting when said second phase starts.

27. The computer system of claim 26 wherein said input stage further comprises:

a switch having a first terminal coupled to a first voltage source, a second terminal coupled to said clock input lead of said first stage, and a third terminal, wherein said switch said is configured to provide a conductive path between said first terminal and said third terminal during said second phase.

* * * * *